US008008139B2

(12) United States Patent
Lim et al.

(10) Patent No.: US 8,008,139 B2
(45) Date of Patent: Aug. 30, 2011

(54) METHOD OF MANUFACTURING THIN FILM TRANSISTOR ARRAY SUBSTRATE

(75) Inventors: Joo Soo Lim, Gyeongbuk (KR); Hee Young Kwack, Seoul (KR)

(73) Assignee: LG Display Co., Ltd., Seoul (KR)

( * ) Notice: Subject to any disclaimer, the term of this patent is extended or adjusted under 35 U.S.C. 154(b) by 42 days.

(21) Appl. No.: 12/544,429

(22) Filed: Aug. 20, 2009

(65) Prior Publication Data

US 2010/0047974 A1 Feb. 25, 2010

(30) Foreign Application Priority Data

Aug. 21, 2008 (KR) .................. 10-2008-0081838

(51) Int. Cl.
*H01L 21/00* (2006.01)
(52) U.S. Cl. ................. 438/158; 438/479; 257/E21.411
(58) Field of Classification Search .................. 438/158, 438/479; 257/E21.411
See application file for complete search history.

(56) References Cited

U.S. PATENT DOCUMENTS 6,451,635 B2 * 9/2002 Park et al. .................... 438/158
2006/0024895 A1 * 2/2006 Kim .............................. 438/299
2007/0153151 A1 * 7/2007 Yang .............................. 349/43
2009/0148970 A1 * 6/2009 Hosoya et al. ................. 438/29

\* cited by examiner

*Primary Examiner* — Alexander G Ghyka
*Assistant Examiner* — Stanetta D Isaac
(74) *Attorney, Agent, or Firm* — Morgan, Lewis & Bockius LLP

(57) ABSTRACT

A simplified method of manufacturing a thin film transistor array substrate is disclosed. The method includes: forming gate electrodes, gate lines and gate pads on a substrate with the use of a first mask; forming a gate insulation film, a semiconductor layer, and a metal layer on the substrate; forming a first photoresist pattern on the metal layer with the use of a second mask; forming first contact holes for the gate pads with the use of the first photoresist pattern; forming a second photoresist pattern, and providing patterns for data pads, data lines, and thin film transistors with the use of the second photoresist pattern; providing a third photoresist pattern, and forming contact holes for source/drain electrodes and second contact holes the gate pads with the use of the third photoresist pattern; forming a protective film on the substrate and providing a fourth photoresist pattern on the protective film with the use of a third mask; forming third contact holes for the gate pads, contact holes for the data pads, gate lines, and drain electrodes, and contact holes for pixel electrodes, with the use of the fourth photoresist pattern; and forming a transparent conduction film on the fourth photoresist pattern having the contact holes.

10 Claims, 19 Drawing Sheets

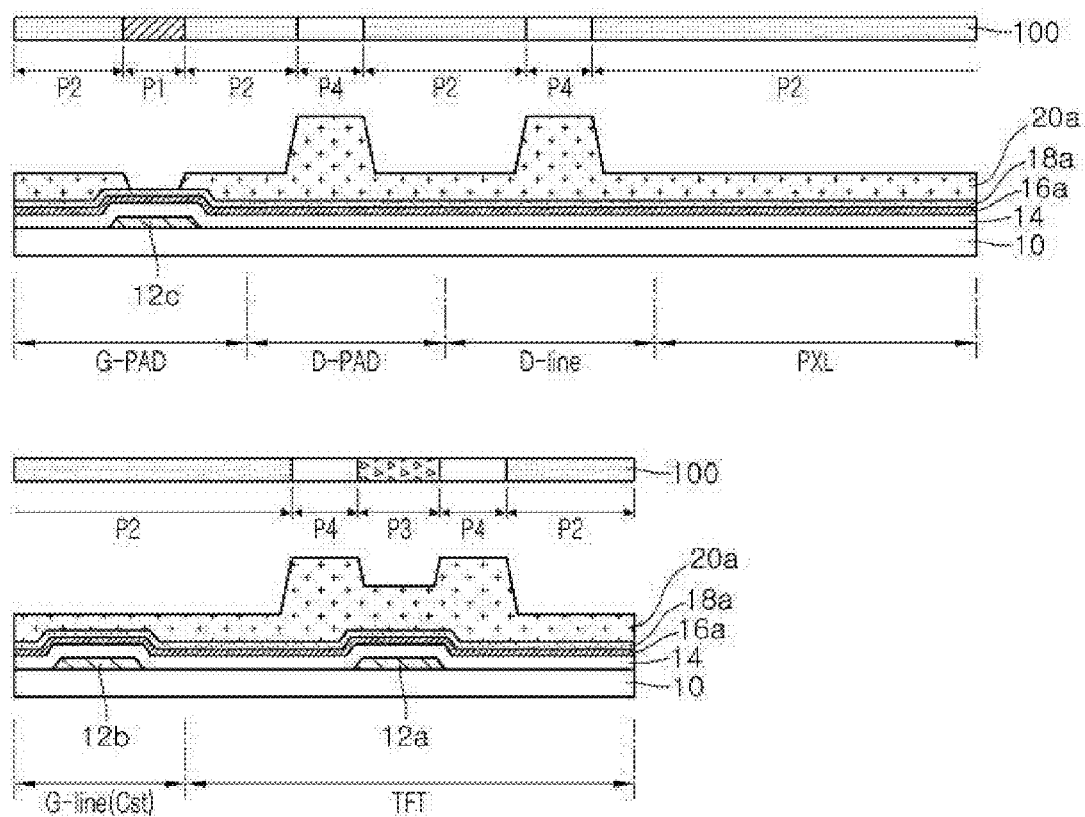

METHOD OF MANUFACTURING THIN FILM TRANSISTOR ARRAY SUBSTRATE

CROSS-REFERENCE TO RELATED APPLICATION

This application claims priority under 35 U.S.C. 119 to Korean Patent Application No. 10-2008-0081838, filed on Aug. 21, 2008, which is hereby incorporated by reference in its entirety.

BACKGROUND

1. Field of the Disclosure

This disclosure relates to a method of manufacturing a liquid crystal display device, and more particularly to a method of manufacturing a thin film transistor array substrate.

2. Description of the Related Art

In general, the liquid crystal display (LCD) device uses an electric field and controls a light transmittance of liquid crystal having a dielectric anisotropy, in order to display pictures. The LCD device is formed by combining a color filter array substrate and a thin film transistor array substrate in the center of liquid crystal.

The TFT array substrate includes a thin film transistor and a pixel electrode which are formed in each pixel region on a substrate. The pixel regions are defined by crossing gate lines and data lines on the substrate. The thin film transistor responds to a gate signal from the gate line and applies a data signal from the data line to the pixel electrode. The pixel electrode is formed of a transparent conduction layer. This pixel electrode depends on the data signal from the thin film transistor and drives the liquid crystal. The liquid crystal allows its molecules to rotate in accordance with an electric field, which is formed by the data signal on the pixel electrode and a common voltage on a common electrode, and controls its light transmittance, thereby implementing a gray scale. The common voltage is provided as a reference of driving the liquid crystal. The common electrode receiving such a common voltage can be formed on either the thin film transistor array substrate or the color filter array substrate.

The thin film transistor array substrate of the LCD device is manufactured through multiple masking processes. Each masking process involves a plurality of steps including depositing a thin film, washing the thin film, forming a photoresist pattern, etching the thin film, stripping the photoresist pattern, testing the etched thin film, etc. Such multiple masking processes become the primary factor in complicating the manufacturing process of the thin film transistor array substrate and increasing the cost of the LCD device.

To address this matter described above, a four-step masking process, which uses a diffraction-light exposing mask and reduces the procedure by one step from a previous five-step masking process, has been proposed as a part of the manufacturing method of the TFT array substrate. The four-step masking process includes a first masking process for forming gate patterns, a second masking process for forming semiconductor and source/drain patterns, a third masking process for forming a protective film pattern, and a fourth masking process for forming transparent electrode patterns.

However, since the four-step masking process is also complicated, it continues to be difficult to decrease the manufacturing cost. Accordingly, a simpler manufacturing method adapted to reduce more of the manufacturing cost of the thin film transistor array substrate is required.

BRIEF SUMMARY

Accordingly, the present embodiments are directed to a manufacturing method of thin film transistor array substrate that substantially obviates one or more of problems due to the limitations and disadvantages of the related art.

An object of the present embodiment is to provide a manufacturing method of thin film transistor array substrate that is simplified in order to cut down more of the manufacturing cost.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a manufacturing method of TFT array substrate includes: forming gate electrodes, gate lines and gate pads on a substrate with the use of a first mask; forming a gate insulation film, a semiconductor layer, and a metal layer on the substrate; forming a first photoresist pattern on the metal layer with the use of a second mask; forming first contact holes for the gate pads with the use of the first photoresist pattern; ashing the first photoresist pattern to form a second photoresist pattern, and forming patterns for data pads, data lines, and thin film transistors with the use of the second photoresist pattern; ashing the second photoresist pattern to form a third photoresist pattern, and forming contact holes for source/drain electrodes and second contact holes the gate pads with the use of the third photoresist pattern; forming a protective film on the substrate and providing a fourth photoresist pattern on the protective film with the use of a third mask; forming third contact holes for the gate pads, contact holes for the data pads, gate lines, and drain electrodes, and contact holes for pixel electrodes, with the use of the fourth photoresist pattern; forming a transparent conduction film on the fourth photoresist pattern having the contact holes, to provide first transparent electrodes for the gate pads into the third contact holes, second transparent electrodes into the contact holes for the data pads, third transparent electrodes into the contact holes for the pixel electrodes, fourth transparent electrodes into the contact holes for the gate lines, and fifth transparent electrodes into the contact holes for the drain electrodes; and removing the fourth photoresist pattern. Wherein the third mask includes transmissive regions transmitting lights, semi-transmissive regions partially transmitting and intercepting the lights, and interceptive regions intercepting the lights, and the three regions have different transmittances.

The second mask may include a transmissive region transmitting the lights, first and second semi-transmissive regions partially transmitting and intercepting the lights, and an interceptive region intercepting the lights. These four regions have different transmittances.

Parts of the fourth photoresist pattern forming the contact holes for the pixel electrodes may be opposed to the semi-transmissive regions and transmissive regions of the third mask which is alternately arranged.

The third transparent electrode may be about 1.8-2.2 µm in width. Also, the metal layer may include copper Cu.

A manufacturing method of TFT array substrate, according to another aspect of the present embodiment, includes: forming gate electrodes, gate lines and gate pads on a substrate with the use of a first mask; forming a gate insulation film, a semiconductor layer, and a metal layer on the substrate; forming a first photoresist pattern on the metal layer with the use of a second mask; forming first contact holes for the gate pads, patterns for the gate pads and gate lines, and patterns for data lines and thin film transistors, with the use of the first photoresist pattern; ashing the first photoresist pattern to form a second photoresist pattern, and forming source/drain electrodes and second contact holes for the gate pads and removing the metal layer of the patterns for the gate pads and lines, with the use of the second photoresist pattern; forming a protective film on the substrate and providing a third photoresist pattern on the protective film with the use of a third mask; forming third contact holes for the gate pads, contact holes for pixel electrodes, and contact holes for the gate lines and drain electrodes, with the use of the third photoresist pattern; forming a transparent conduction film on the third photoresist pattern having the contact holes, to provide first transparent electrodes into the third contact holes for the gate pads, second transparent electrodes into the contact holes for the pixel electrodes, third transparent electrodes into the contact holes for the gate lines, and fourth transparent electrodes into the contact holes for the drain electrodes; and removing the third photoresist pattern. Wherein the third mask includes transmissive regions transmitting lights, semi-transmissive regions partially transmitting and intercepting the lights, and interceptive regions intercepting the lights, and the three regions have different transmittances.

Parts of the third photoresist pattern forming the contact holes for the pixel electrodes can be opposed to the semi-transmissive regions and transmissive regions of the third mask, which is alternately arranged, or only to the transmissive regions of the third mask.

The second transparent electrode may be about 1.8-2.2 μm in width. Also, the metal layer may include molybdenum Mo.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings:

FIG. 1A to 1H are cross sectional views sequentially explaining the steps of a manufacturing method of TFT array substrate according to a first embodiment of the present disclosure;

DETAILED DESCRIPTION

Figure 1A:
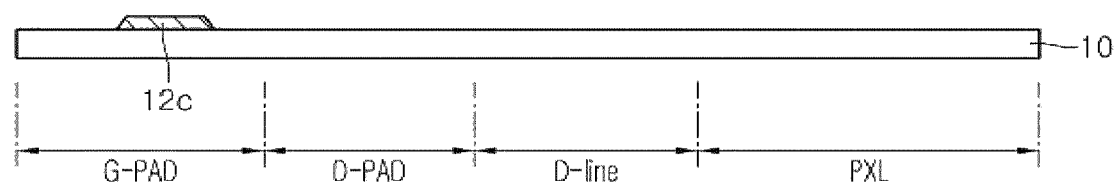
Figure 1A:
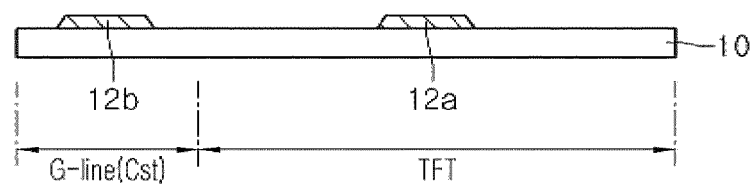

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1A to 1H are cross sectional views sequentially explaining the steps of a manufacturing method of TFT array substrate according to a first embodiment of the present disclosure.

First, a gate electrode 12a, a gate line 12b, and a gate pad 12c are formed on a substrate 10, as shown in FIG. 1A.

The substrate 10 is defined into a gate pad formation region G-Pad, a data pad formation region D-Pad, a data line formation region D-line, a pixel formation region PXL, a gate line formation region G-line, a storage capacitor formation region Cst, and a thin film transistor formation region TFT. Herein, the gate line formation region G-line and the storage capacitor formation region Cst are positioned in the same location. Accordingly, these regions G-line and Cst will now be cited as a common term of "gate line formation region G-line(Cst)."

The gate electrode 12a, the gate line 12b, and the gate pad 12c are formed by sequentially providing a first metal layer and a photoresist layer (not shown), providing a first photoresist pattern (not shown) by photolithographing a first mask (not shown) into the photoresist layer, and etching the first metal layer using the first photoresist pattern as an etch mask.

As shown in FIG. 1B, a gate insulation film 14, a semiconductor layer 16a, and a second metal layer 18a are sequentially formed on the substrate 10, loaded with the gate electrode, the gate line, and the gate pad 12a, 12b, and 12c, before forming a second photoresist pattern 20a on the second metal layer 18a.

The photoresist pattern 20a is formed by providing a photoresist on the second metal layer 18a and performing photolithography with the use of a second mask 100. For the second mask 100, a mask having four transmittances which differ from one another by region may be used. In other words, the second mask 100 includes a transmissive region P1 which transmits lights, first and second semi-transmissive regions P2 and P3 which partially transmit and intercept the lights, and an interceptive region P4 which intercepts the lights.

The first semi-transmissive region P2 has a transmittance higher than that of the second semi-transmissive region P3, enabling a thickness of the photoresist layer formed by the photolithographic process in the first semi-transmissive region P2 to be thinner than that of the photoresist layer in the second semi-transmissive region P3. Also, the photoresist layer formed through the photolithography may be the thickest in the interceptive region P4, having the lowest transmittance, and the thinnest in the transmissive region P1, having the highest transmittance.

More specifically, the interceptive region P4 is disposed in correspondence with the data pad formation region D-Pad, the data line formation region D-line, and a part of the thin film transistor formation region TFT in which source/drain electrodes will be formed, so that the second photoresist pattern 20a in the interceptive region P4 is of greatest thickness. The second semi-transmissive region P3 is disposed in correspondence with another part of the thin film transistor formation region TFT in which a channel will be formed, allowing the second photoresist pattern 20a in the second semi-transmissive region P3 to have the thickness thinner than that of the interceptive region P4. The first semi-transmissive region P2 is disposed in correspondence with the pixel formation region PXL, the gate line formation region G-line(Cst), and a part of the gate pad formation region G-Pad, so that the second photoresist pattern 20a in the first semi-transmissive region P2 is thinner than that of the second semi-transmissive region P3. The transmissive region P1 is disposed opposite to the other part of the gate pad formation region G-Pad and allows the second photoresist pattern 20a in the transmissive region P1 to be thinner than that of the first semi-transmissive region P2. Actually, since there is no second photoresist pattern 20a in the transmissive region P1, the second metal layer 18a is exposed there. As the second metal layer 18a, copper Cu may be used.

Figure 1C:
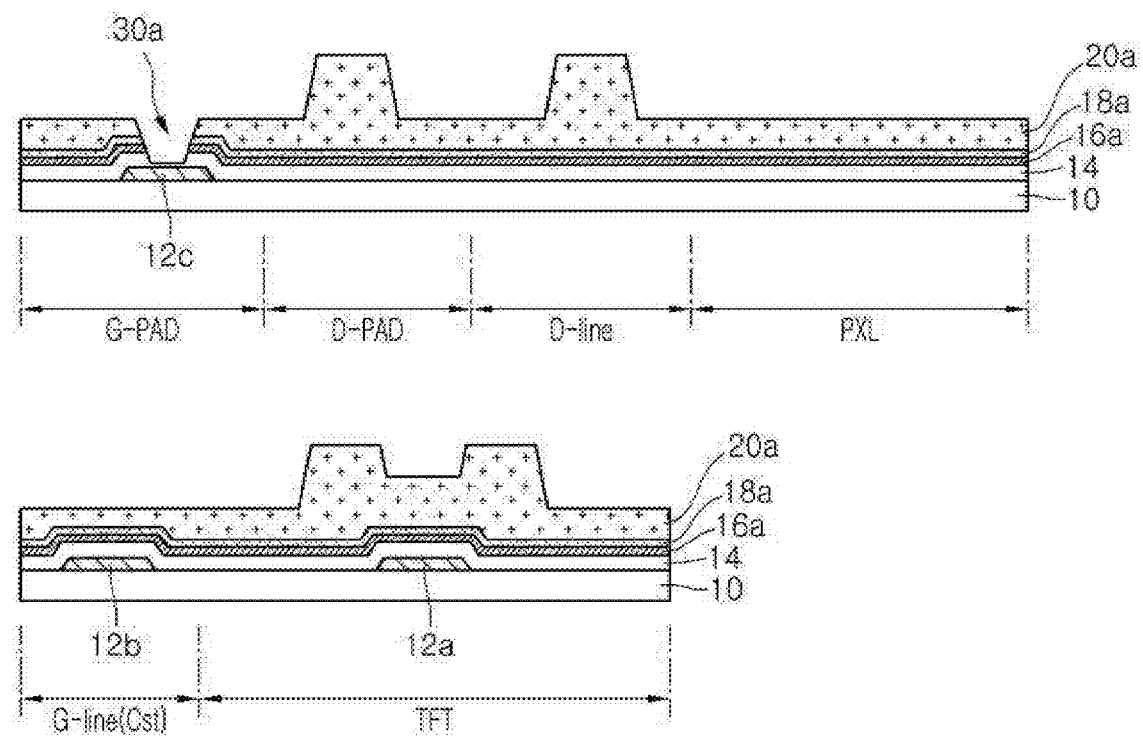

On the substrate 10 with the second photoresist pattern 20a, a first contact hole 30a for the gate pad is formed as shown in FIG. 1C. The first contact hole 30a is formed through an etching process using the second photoresist pattern 20a, which is formed on the substrate 10, as an etch mask. More specifically, since the second photoresist pattern 20a is formed to exposes the second metal layer 18a in the gate pad formation region G-Pad, the second metal layer 18a, the semiconductor layer 16a, and a portion of fixed thickness of the gate insulation film 14 are etched through the etch process, thereby forming the first contact hole 30a for the gate pad. The etching of the second metal layer 18a using the second photoresist pattern 20a may be performed in a wet etch process, while the etching of the semiconductor layer 16a and the gate insulation film 14 may be performed in a dry etch process.

Figure 1D:
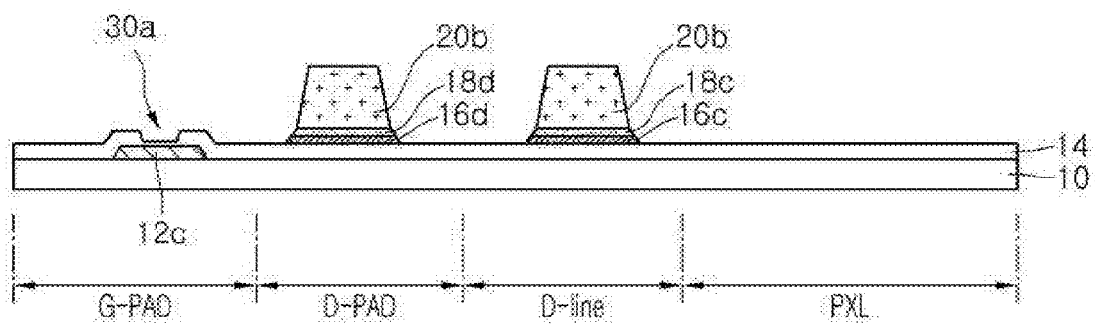
Figure 1D:
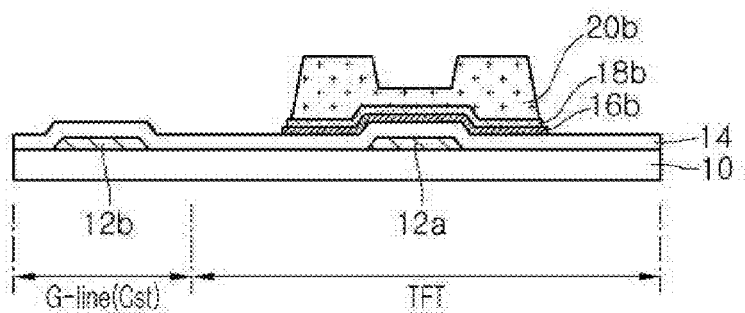

Referring to FIG. 1D, a third photoresist pattern 20b is formed on the substrate 10 including the first contact hole 30a for the gate pad. Then patterns 18b and 16b for thin film transistor, patterns 18c and 16c for the data line, and patterns 18d and 16d for the data pad are formed with the use of the third photoresist pattern 20b.

The third photoresist pattern 20b is formed by removing a first fixed thickness portion from the second photoresist pattern 20a through an ashing process. Such a third photoresist pattern 20b remains by a second fixed thickness in the data pad formation region D-Pad, the data line formation region D-line, and the thin film transistor formation region TFT, while it is completely removed from the pixel formation region PXL, the gate line formation region G-line(Cst), and the gate pad formation region G-Pad. Accordingly, the third photoresist pattern 20b exposes the most upper layer, that is, the second metal layer 18a in these pixel formation region PXL, gate line formation region G-Line(Cst), and gate pad formation region G-Pad.

Also, the second metal layer 18a and semiconductor layer 16a are removed from the pixel formation region PXL, gate line formation region G-Line(Cst), and gate pad formation region G-Pad, through the etching process using the third photoresist pattern 20b as an etch mask, and are patterned into the shape of the data pad formation region D-Pad, the data line formation region D-Line, and the thin film transistor formation region TFT. As such, the thin film transistor pattern of a double layer structure 18b and 16b, the data line pattern of a double layer structure 18c and 16c, and the data pad pattern of a double layer structure 18d and 16d are provided. Herein, the second metal layer 18a may be removed by the wet etch process using the third photoresist pattern 20b, and the semiconductor layer 16a may be removed by the dry etch process.

Figure 1E:
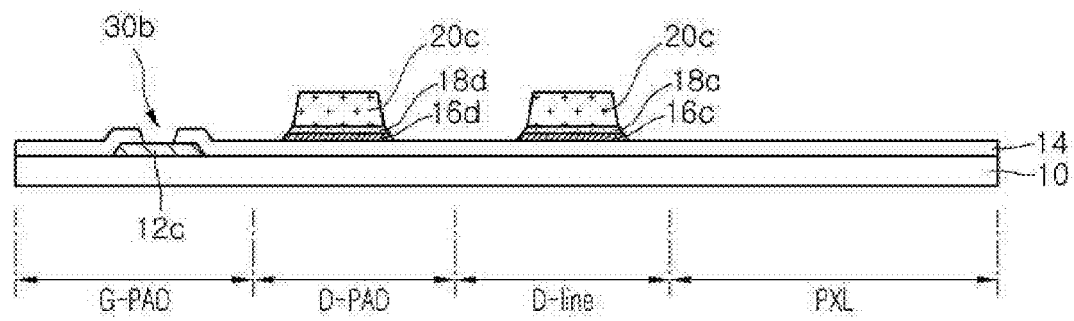
Figure 1E:
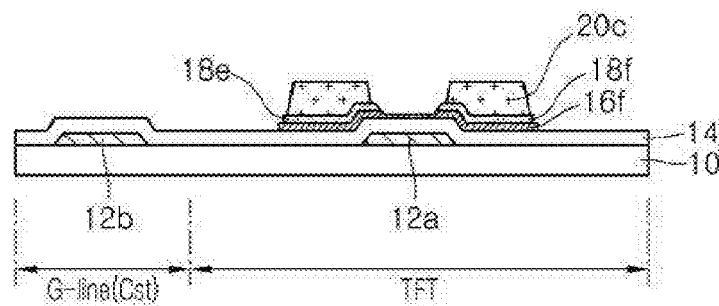

On the substrate 10 with the third photoresist pattern 20b, the thin film transistor pattern 18b and 16b, the data line pattern 18c and 16c, and the data pad pattern 18d and 16d, a fourth photoresist pattern 20c is formed before providing source/drain electrodes 18e and 18f and a second contact hole 30b for the gate pad through the use of the third photoresist pattern 20b, as shown in FIG. 1E.

The fourth photoresist pattern 20c can be formed by removing a portion of third fixed thickness from the third photoresist pattern 20b through the ashing process. At this time, the third photoresist pattern 20b is completely removed from one part of the thin film transistor formation region TFT in which the channel will be formed, thereby exposing the second metal layer 18a therein.

Sequentially, the second metal layer 18a and a fourth fixed thickness portion of the semiconductor layer 16b are removed, from the one part of the thin film transistor formation region TFT in which the channel will be formed, through the etching process using the fourth photoresist pattern 20c as an etch mask. As such, the source/drain electrodes 18e and 18f and the patterned semiconductor layer 16f are formed. Also, the gate insulation film 14 with the first contact hole 30a for the gate pad is dry-etched by a fifth fixed thickness so that a second contact hole 30b for the gate pad is formed. The second contact hole 30b exposes the gate pad 12c. The partial patterning process of the semiconductor layer removes only an n+ amorphous extrinsic silicon layer from the semiconductor layer pattern 16b, that includes an amorphous intrinsic silicon layer and the n+ amorphous extrinsic silicon layer, thereby remaining the amorphous intrinsic silicon layer. In other words, the semiconductor layer pattern 16f includes only the amorphous intrinsic silicon layer in the channel region. Moreover, the thin film transistor pattern 18b of the second metal layer may be etched through the wet etch process using the fourth photoresist pattern 20c, and the thin film transistor pattern 16b of the semiconductor layer may be etched through the dry etch process.

Figure 1F:
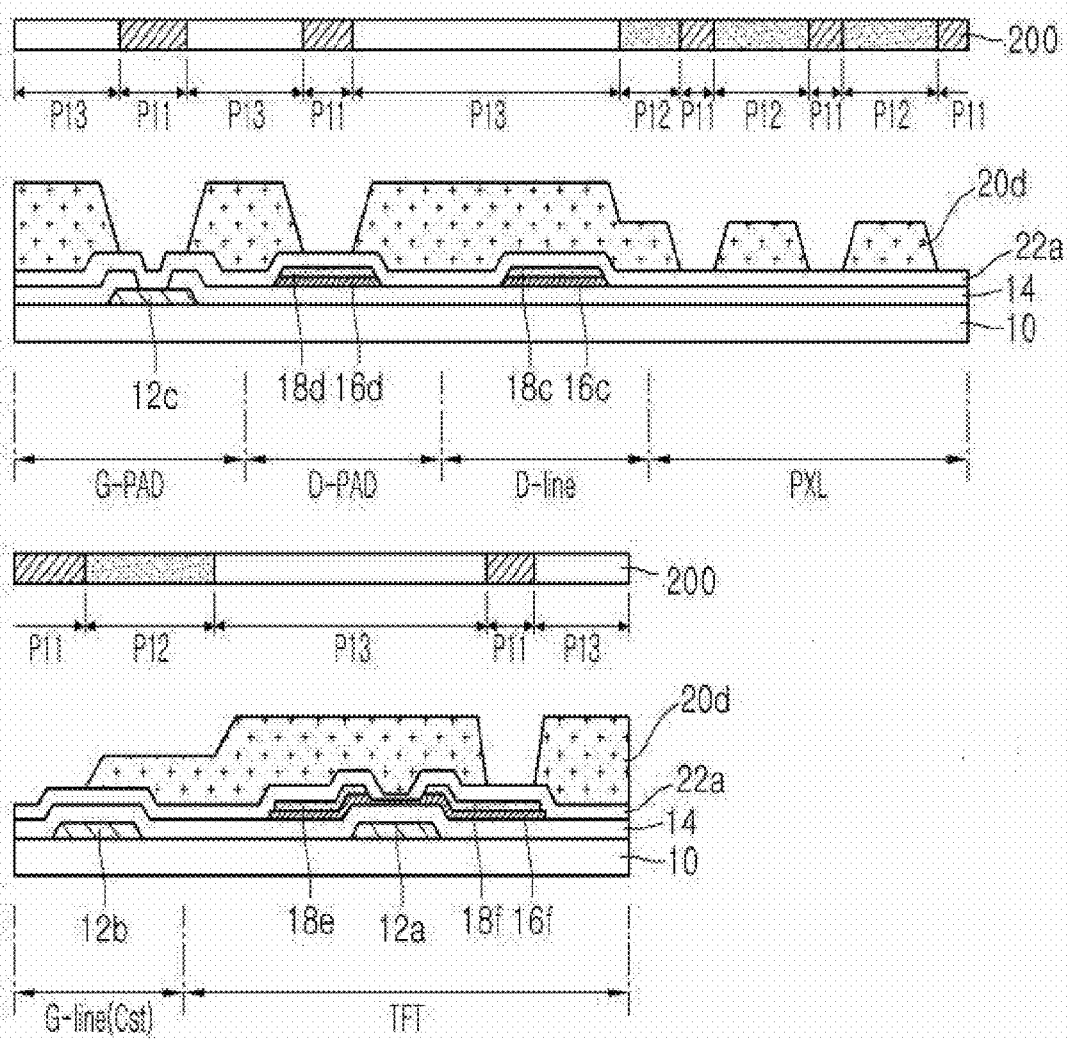

As shown in FIG. 1F, the fourth photoresist pattern 20c is removed from the substrate 10, where the source/drain electrodes 18e and 18f and the second contact hole 30b for the gate pad are formed, before sequentially forming a protective film (or a passivation layer) 22a and a fifth photoresist pattern 20d on the substrate 10. The fifth photoresist pattern 20d is formed by providing a photoresist layer on the protective film 22a and photolithographing the photoresist layer with the use of a third mask 200. As the third mask 200, a mask including a transmissive region P11 transmitting lights, a semi-transmissive region P12 having a plurality of slits for partially transmitting and intercepting the lights, and an interceptive region P13 intercepting the lights may be used. The transmissive region P11 is disposed in the gate pad formation region G-Pad, the data pad formation region D-Pad, part of the gate line formation region G-line(Cst), part of the pixel formation region PXL, and part of the thin film transistor formation region TFT where the drain electrode is formed. The semi-transmissive region P12 corresponds to the other part of the gate line formation region G-line(Cst) and the other part of the pixel formation region PXL. The transmissive region P11 and semi-transmissive region P12 included in the pixel formation region PXL are arranged alternately with each other.

Figure 1G:
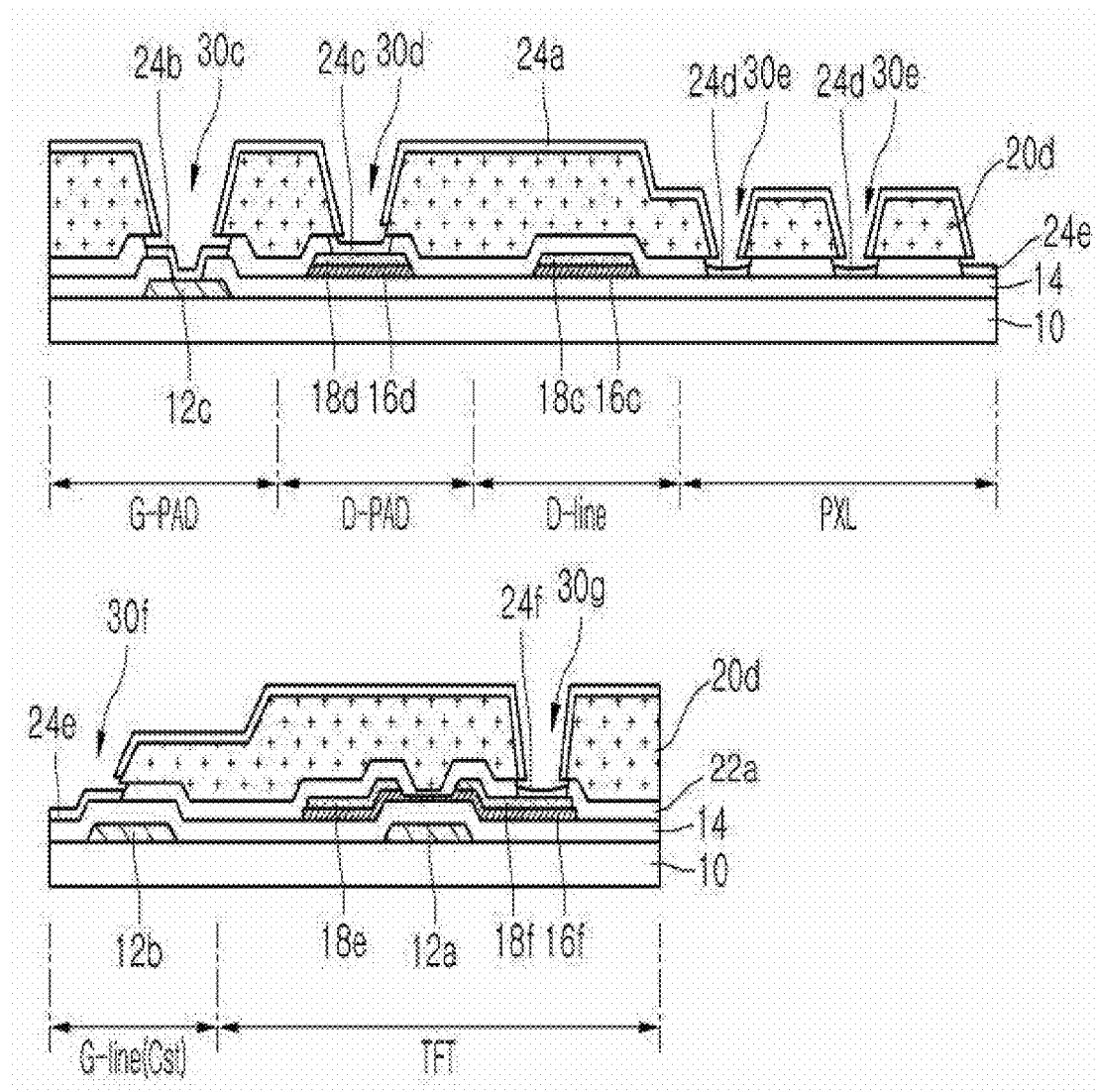

Referring to FIG. 1G, a third contact hole 30c for the gate pad, a contact hole 30d for the data pad, contact holes 30e for the pixel electrodes, a contact hole 30f for the gate line, and a contact hole 30g for the drain electrode are formed on the protective film 22a of the substrate 10 including the fifth photoresist pattern 20d, before providing a transparent conduction film 24a on the fifth photoresist pattern 20d.

The third contact hole 30c for the gate pad and the contact hole 30c for the gate pad, the contact hole 30d for the data pad, the contact holes 30e for the pixel electrodes, the contact hole 30f for the gate line, and the contact hole 30g for the drain electrode are formed by etching the protective film 22a using the fifth photoresist pattern 20d as an etch mask. As such, the third contact hole 30c exposes the gate pad 12c in the gate pad formation region G-Pad, the contact hole 30d exposes the upper surface of the data pad pattern 18d in the data pad formation region D-Pad, the contact hole 30e for the pixel electrode exposes the gate insulation film 14 in the pixel formation region PXL, the contact hole 30f for the gate line exposes the gate insulation film 14 in the gate line formation region G-line(Cst), and the contact hole 30g exposes the drain electrode 18f in the thin film transistor formation region TFT.

In this time, the contact hole 30e for the pixel electrode is formed opposite the transmissive region P11 of the second mask 200, and the semi-transmissive region P12 is disposed on both sides of the transmissive region P11. In accordance therewith, the bottom surface of the contact hole 30e may be formed of a width (or size) of about 1.8~2.2 μm.

Figure 2:
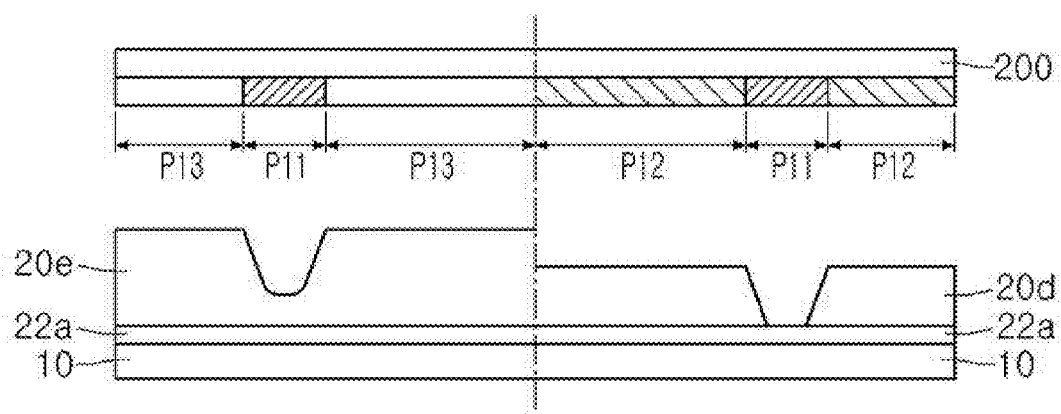
FIG. 2 is a cross sectional view explaining methods of creating a pattern having a width of below 4 μm, according to the present embodiment and the related art.

On the contrary, if the interceptive region P13 is disposed on both sides of the transmissive region P11 as shown in the left half of FIG. 2, a line pattern can not be implemented of a width of below 4 μm due to the definition of exposure equipment. In detail, when the size of transmissive region becomes below 4 μm, a distribution of exposed lights varies smoothly in quantity and the transmissive region and its adjacent regions cause an overlap effect which allows the photoresist to remain, so that the photoresist pattern 20e can not be formed.

To address this problem, the method of the present embodiment can implement the line pattern having a width of below 4 μm by disposing the semi-transmissive region on both sides of the transmissive region, as shown in the right half of FIG. 2. More specifically, although the transmissive region having a size of below 4 μm causes the overlap effect together with the adjacent regions, the photoresist does not remain in the transmissive region because the photoresist in the semi-transmissive region is thinner than that in the interceptive region. Accordingly, the photoresist pattern 20d can be formed, and furthermore the contact hole 30e for the pixel electrode can be formed below 4 μm, i.e., in the size of 1.8~2.2 μm.

Also, as the contact hole 30g for the drain electrode is formed by etching only the protective film 22a, it reduces point defects in comparison with the contact hole for the drain electrode which is formed by etching both the protective film and gate insulation film in the related art.

The formation of the transparent conduction film 24a on the fifth photoresist pattern 20d provides a first transparent electrode 24b on the gate pad 12c exposed by the third contact hole 30c, a second transparent electrode 24c on the upper surface of the data pad pattern 18d exposed by the contact hole 30d for the data pad, a third transparent electrode 24d on the gate insulation film 14 of the pixel formation region PXL which is exposed by the contact hole 30e for the pixel electrode, a fourth transparent electrode 24e on the gate insulation film 14 in the gate line formation region G-Line(Cst) which is exposed by the contact hole 30f, and a fifth transparent electrode 24f on the drain electrode 18f exposed by the contact hole 30g. In such a formation, the third transparent electrode 24d becomes a pixel electrode having a line width of about 1.8~2.2 μm because it is formed in the bottom surface of the contact hole 30e having a size of about 1.8~2.2 μm.

Figure 1H:
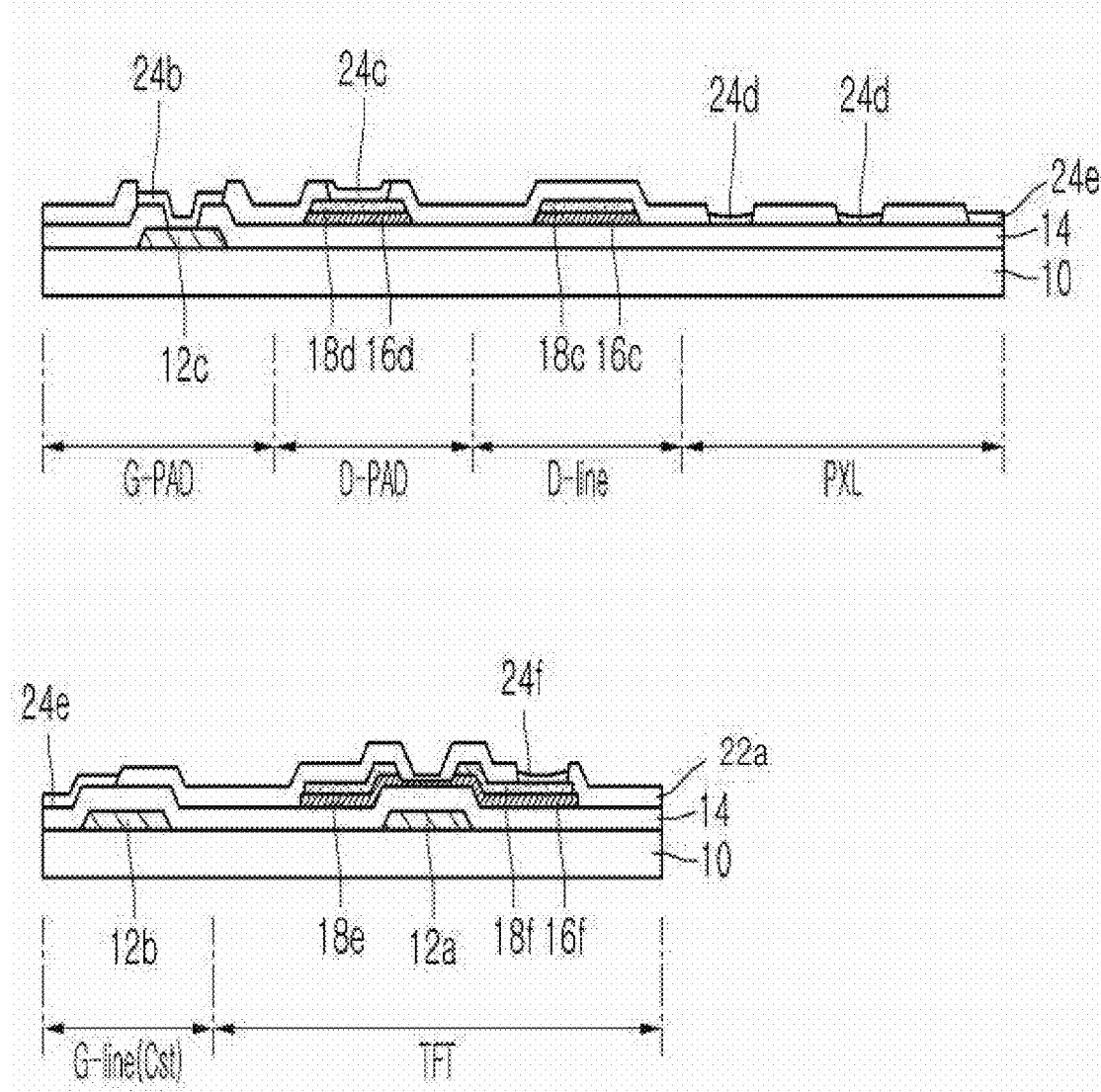

To finish the manufacture of the thin film transistor array substrate, the fifth photoresist pattern 20d is removed together with the transparent conduction film 24a from the substrate 10 by performing a lift-off process, as shown in FIG. 1H.

In this way, the manufacturing method of thin film transistor array substrate according to the first embodiment of the present disclosure uses only three masks, so that it can cut down the manufacturing costs and can simplify the manufacturing process in comparison with the method according to the related art using four masks.

Now, the manufacturing method of thin film transistor array substrate according to the first embodiment using three masks will be compared to the one according to the related art using four masks.

The related art method using four masks includes the first step of washing the substrate, the second step of sputter-depositing the metal film for the gate electrode, the third step of washing the substrate again, the fourth step of performing photolithography with the use of the first mask, the fifth step of etching the metal film for the gate electrode, the sixth step of stripping, the seventh step of CVD-depositing the gate insulation film, the eighth step of CVD-depositing the first and second semiconductor layers, the ninth step of sputter-depositing the metal film for the source/drain electrodes, the tenth step of washing the substrate, the eleventh step of performing photolithography with the use of the second mask, the twelfth and thirteenth steps of sequentially etching the metal film for the source/drain electrodes and the first and second semiconductor layers, the fourteenth and fifteenth steps of sequentially etching the etched metal film for the source/drain electrodes and the etched first semiconductor layer, the sixteenth step of stripping, the seventeenth step of CVD-depositing the protective film, the eighteenth step of washing the substrate, the nineteenth step of performing photolithography with the use of the third mask, the twentieth step of dry-etching the protective film, the twenty-first step of stripping, the twenty-second step of sputter-depositing the metal film for the pixel electrode, the twenty-third step of washing the substrate, the twenty-fourth step of performing photolithography with the use of the fourth mask, the twenty-fifth step of etching the metal film for the pixel electrode, and the twenty-sixth step of stripping.

On the contrary, the present embodiment method using three masks includes the first step of washing the substrate, the second step of sputter-depositing the metal film for the gate electrode, the third step of secondly washing the substrate, the fourth step of performing photolithography with the use of the first mask, the fifth step of etching the metal film for the gate electrode, the sixth step of stripping, the seventh step of CVD-depositing the gate insulation film, the eighth step of CVD-depositing the semiconductor layer, the ninth step of sputter-depositing the metal film for the source/drain electrodes, the tenth step of thirdly washing the substrate, the eleventh step of performing photolithography with the use of the second mask, the twelfth step of firstly etching the metal film for the source/drain electrodes, the thirteenth step of etching the semiconductor layer and the gate insulation film in the structure of FIG. 1C, the fourteenth step of etching the etched metal film for the source/drain electrodes, the fifteenth step of etching the etched semiconductor layer in the structure of FIG. 1D, the sixteenth step of etching once more the etched metal film for the source/drain electrodes, the seventeenth step of etching once more the etched semiconductor layer in the structure of FIG. 1E, the eighteenth step of stripping, the nineteenth step of CVD-depositing the protective film, the twentieth step of fourthly washing the substrate, the twenty-first step of performing photolithography with the use of the third mask, the twenty-second step of etching the protective film, the twenty-third step of sputter-depositing the metal film for the pixel electrode, and the twenty-fourth step of stripping.

As thus described, the manufacturing method of the thin film transistor array substrate using three masks can reduce the process by two steps in comparison with the one using four masks, thereby providing the effect of manufacturing process simplification.

Also, the third transparent electrode 24d for the pixel electrode is formed in the line width of about 1.8~2.2 μm and increases the aperture ratio of pixel, with the effect of providing improved brightness.

Moreover, since the contact hole for the drain electrode is formed by etching only the protective film 22a, the point defect caused by forming the contact hole for the drain electrode through the etch process of both of the protective film and the gate insulation film in the related art can be prevented.

FIGS. 3A to 3H are cross sectional views sequentially explaining a manufacturing method of thin film transistor array substrate according to a second embodiment of the present disclosure. The method of the second embodiment proceeds on the triple mask process. The thin film transistor array substrate manufactured by the method of the second embodiment is applied to an LCD device of horizontal electric field system.

Figure 3A:
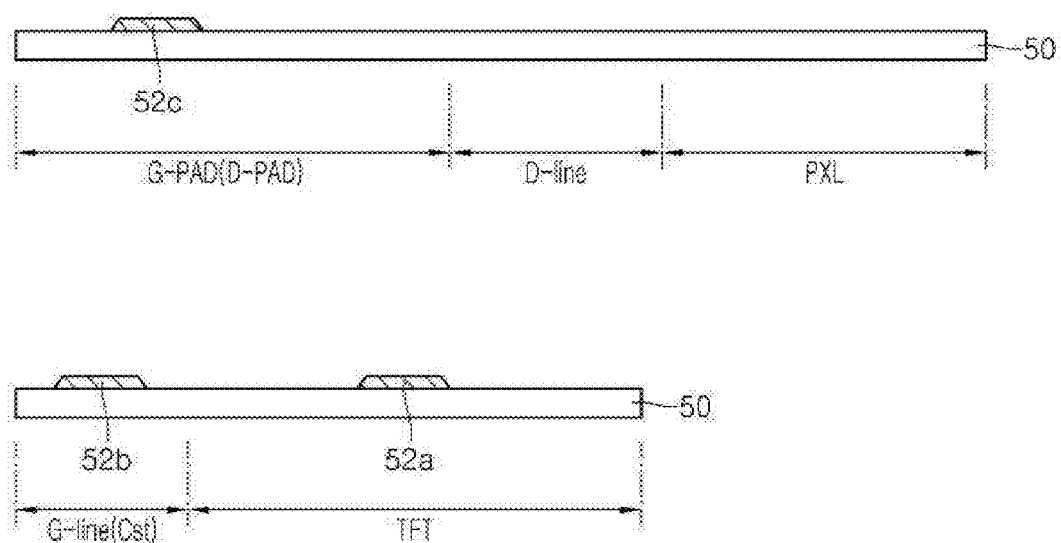
FIG. 3A to 3H are cross sectional views sequentially explaining the steps of a manufacturing method of TFT array substrate according to a second embodiment of the present disclosure.

As shown in FIG. 3a, a gate electrode 52a, a gate line 52b, and a gate pad 52c are firstly formed on a substrate 50.

The substrate 50 is defined into a gate pad formation region G-Pad, a data pad formation region D-Pad, a data line formation region D-line, a pixel formation region PXL, a gate line formation region G-line, a storage capacitor formation region Cst, and a thin film transistor formation region TFT. Herein, since the gate pad formation region G-Pad has the same structures as those in the data pad formation region D-Pad, these regions G-Pad and D-Pad will now be referred to a common term of "gate pad formation region G-Pad(D-Pad)." Similarly, the structures in the gate line formation region G-line are the same as those in the storage capacitor formation region Cst, so that these regions G-line and Cst will also be cited as a common term of "gate line formation region G-line (Cst)."

The gate electrode 52a, the gate line 52b, and the gate pad 52c are formed by sequentially providing a first metal layer and a photoresist layer (not shown), patterning a first photoresist pattern (not shown) through a method of photolithographing a first mask (not shown) in the photoresist layer, and etching the first metal layer using the first photoresist pattern as an etch mask.

Figure 3B:
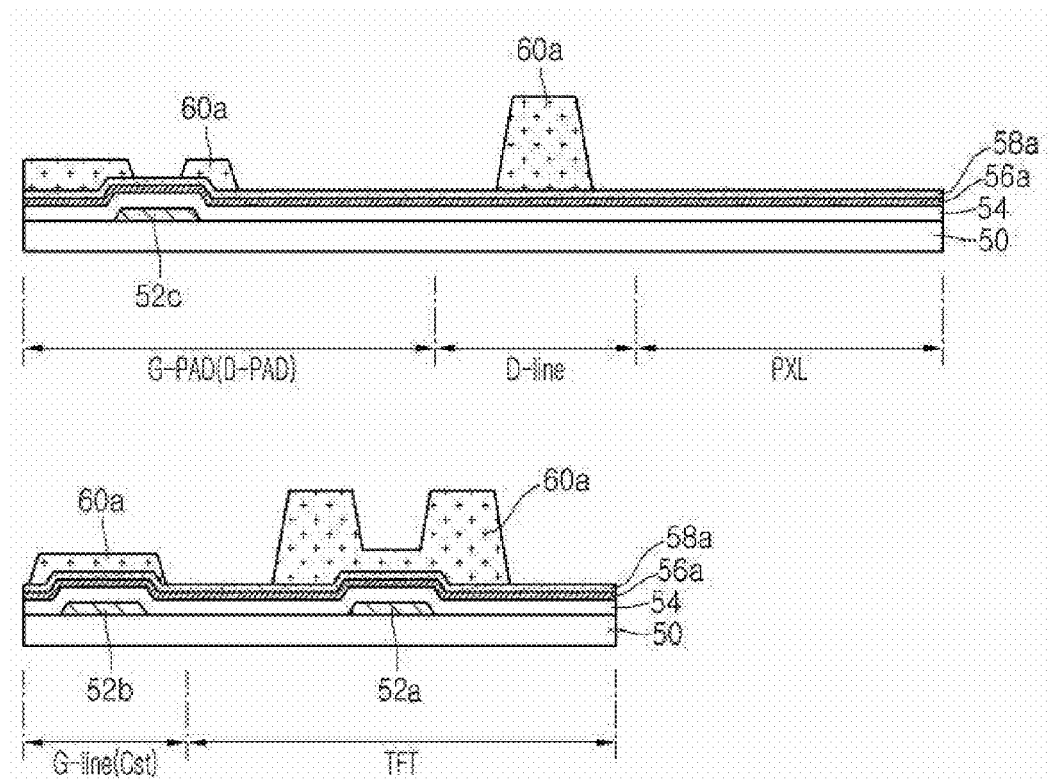

A gate insulation film 54, a semiconductor layer 56a, and a second metal layer 58a are sequentially formed on the substrate 50, loaded with the gate electrode 52a, gate line 52b, and gate pad 52c, before forming a second photoresist pattern 60a on the second metal layer 58a, as shown in FIG. 3B.

The photoresist pattern 60a is formed through the steps of providing a photoresist layer on the second metal layer 58a and performing photolithography with the use of a second mask. For the second mask, a mask having three transmittances which differ from one another by region may be used. In other words, the second mask includes a transmissive region which transmits lights, a semi-transmissive region which has a plurality of slits and partially transmits and intercepts the lights, and an interceptive region which intercepts the lights.

More specifically, the semi-transmissive region is disposed in correspondence with the gate line formation region G-line, a part of the gate pad formation region G-Pad(D-Pad), and a part of the thin film transistor formation region TFT in which a channel will be formed. The interceptive region is disposed in correspondence with the data line formation region D-line and the other part of the thin film transistor formation region TFT in which source/drain electrodes will be formed. The transmissive region is disposed opposite the other part of the gate pad formation region G-Pad(D-Pad) and the pixel formation region PXL. Accordingly, the second photoresist pattern 60a in the semi-transmissive region is thinner than that in the interceptive region. Also, since there is no second photoresist pattern 60a in the transmissive region, the second metal layer 58a is exposed there. The second metal layer 58a may include molybdenum Mo.

Figure 3C:
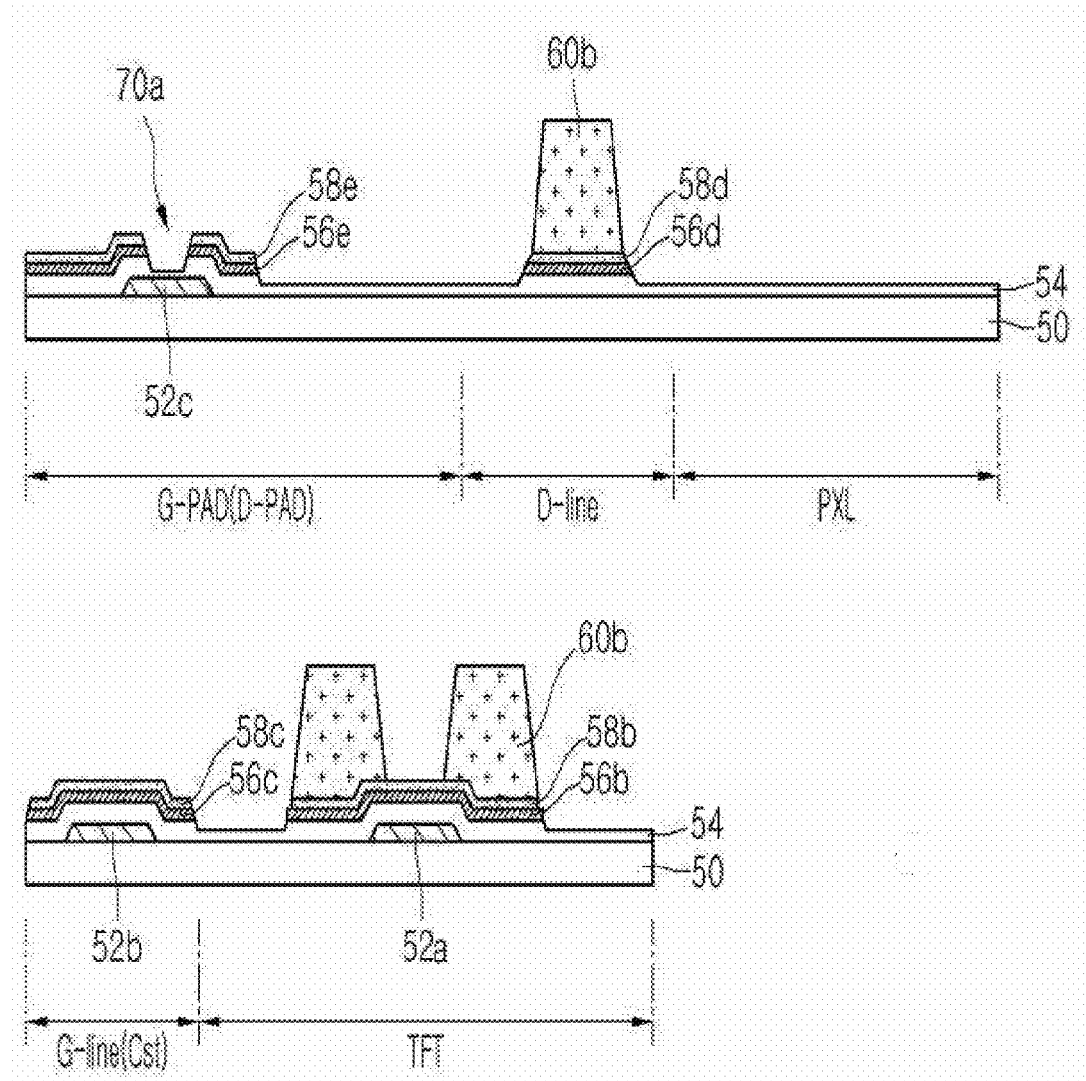

Using the second photoresist pattern 60a on the substrate 50, a first contact hole 70a for the gate pad, a pattern of double layer structure 58b and 56b for the thin film transistor, a pattern of double layer structure 58c and 56c for the gate line, a pattern of double layer structure 58d and 56d for the data line, and a pattern of double layer structure 58e and 56e for the gate pad are formed as shown in FIG. 3C. Then, a third photoresist pattern 60b is formed on the substrate 50. The double layer structure patterns each have a semiconductor layer pattern 56b-56e and a second metal layer pattern 58b-58e.

The first contact hole 70a for the gate pad and the patterns 56b-56e and 58b-58e for the thin film transistor, gate line, data line, and gate pad are formed by using the second photoresist pattern 60a as an etch mask and etching the second metal layer 58a, the semiconductor layer 56a, and a first fixed thickness portion of the gate insulation film 54. This results from that the second photoresist pattern 60a is formed in the gate pad formation region G-Pad(D-Pad), the data line formation region D-Line, the gate line formation region G-Line (Cst), and the thin film transistor formation region TFT.

Figure 3D:
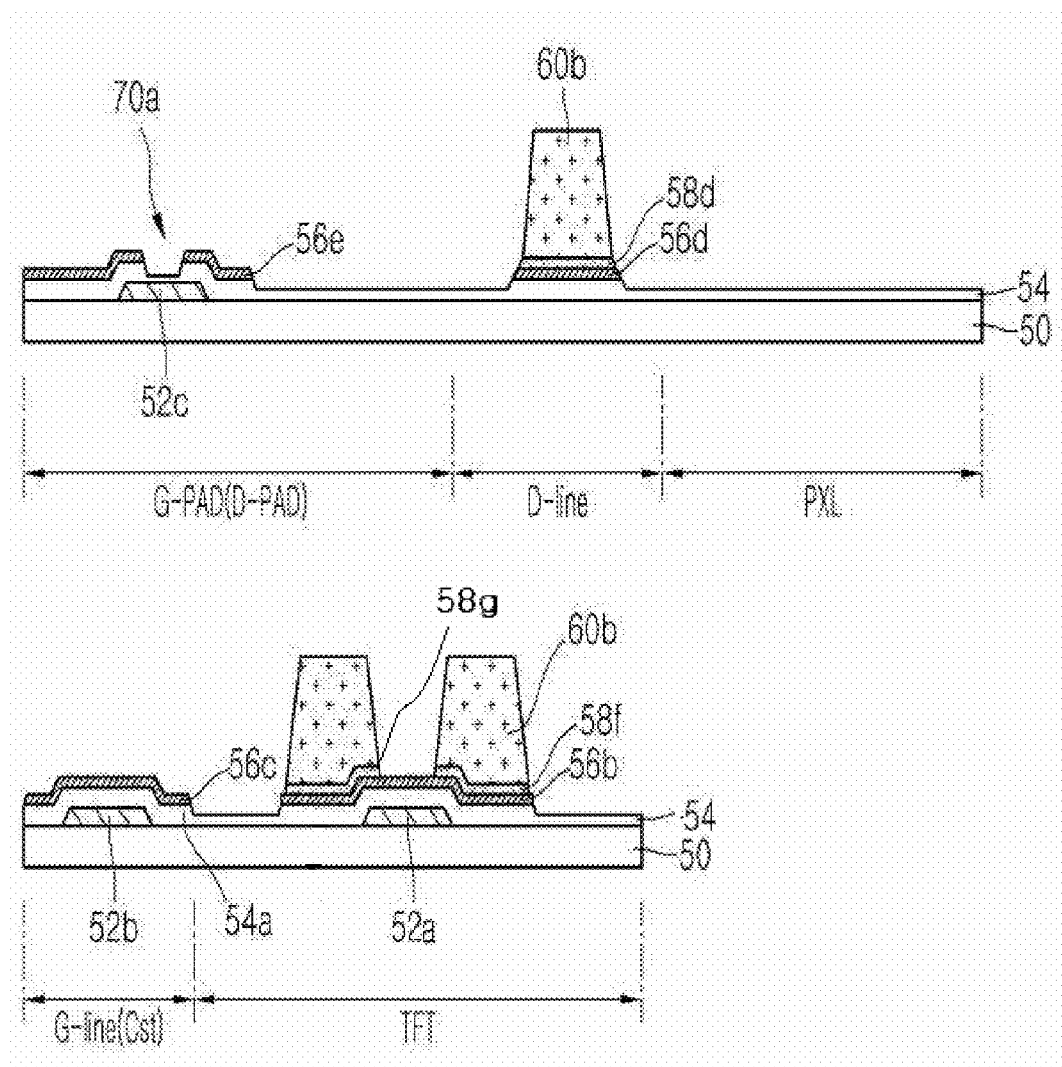

The etching of the second metal layer 58a through the use of the second photoresist pattern 60a may be performed in a wet etch process, while the etching of the semiconductor layer 56a and the first fixed thickness portion of the gate insulation layer 54 may be performed in a dry etch process. The second photoresist pattern 60a is removed by a second fixed thickness through an ashing process, thereby forming the third photoresist pattern 60b As shown in FIG. 3D, the second metal layer patterns 58b, 58c, and 58e are etched using the third photoresist pattern 60b as an etch mask. Accordingly, the drain/source electrodes 58f and 58g are formed, while the second metal layer pattern 58c of the double layer structure pattern 58c and 56c for the gate line and the second metal layer pattern 58e of the double structure pattern 58e and 56e for the gate pad are removed. This etching of the second metal layer patterns 58b, 58c, and 58e through the use of the third photoresist pattern 60b may be performed in the wet-etch process. At this time, the semiconductor layer patterns 56c and 56e of the pattern of double layer structure 56c and 58c for the gate line and the pattern of double layer structure 56e and 58e for the gate pad are not removed, in order to prevent a point defect caused by connecting the residents of the second metal layer pattern 58c (i.e., molybdenum) with the first metal layer pattern 52b which is used for the lower electrode of the storage capacitor. In other words, only the second metal layer patterns 58c and 58e are preferably removed with the exception of the semiconductor layer patterns 56c and 56e.

Figure 3E:
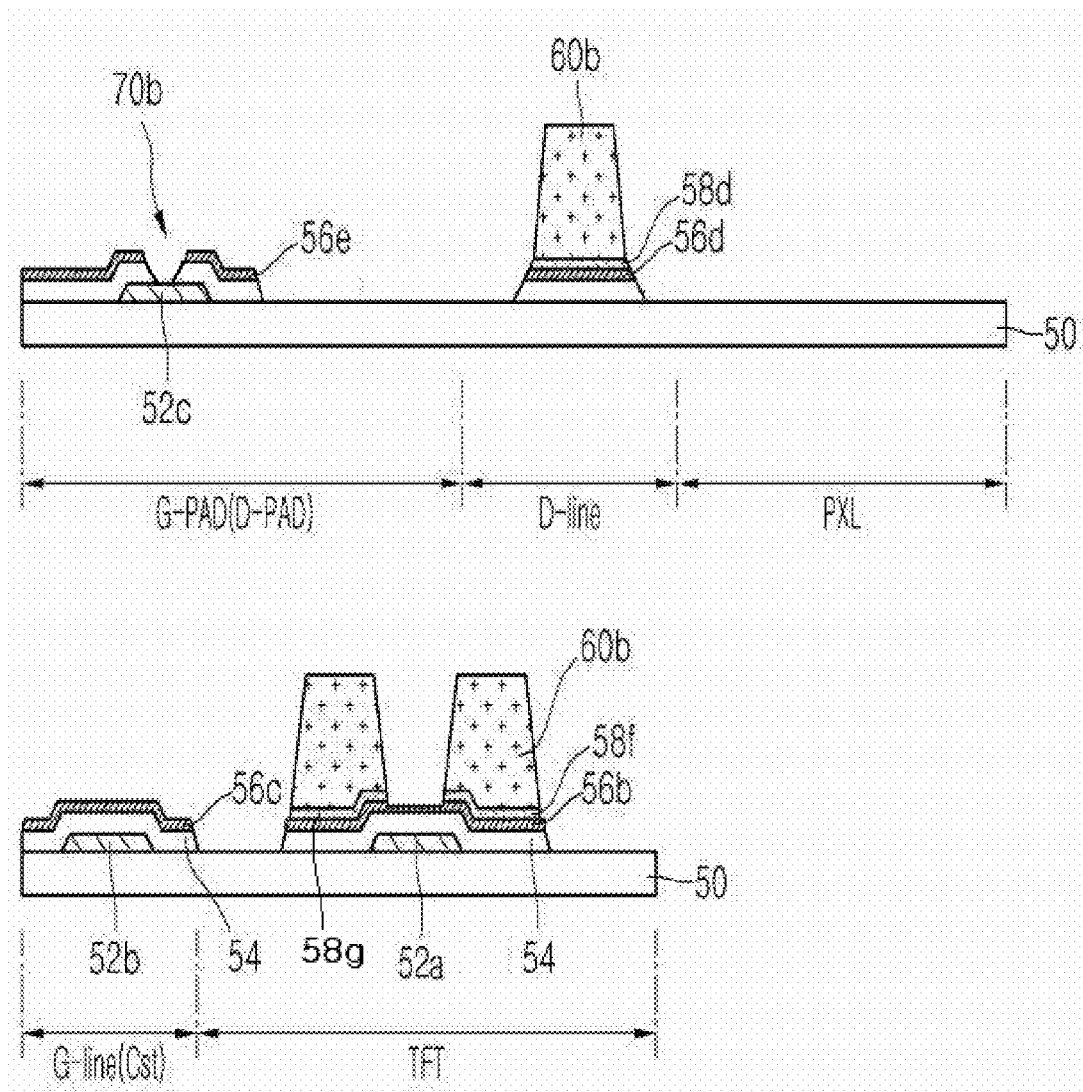

Sequentially, the residual of the gate insulation film 54 and third fixed thickness portions of the semiconductor layer patterns 56b, 56c and 56e are removed using the third photoresist pattern 60b an the etch mask, as shown in FIG. 3E. As such, a second contact hole 70b for the gate pad is formed. Also, only an n+ amorphous extrinsic silicon layer of the semiconductor layer patterns 56b, 56c, and 56e which each include an amorphous intrinsic silicon layer and the n+ amorphous extrinsic silicon layer, is removed, thereby remaining the amorphous intrinsic silicon layer. In other words, the remaining semiconductor layer patterns 56b, 56c, and 56e include only the amorphous intrinsic silicon layer.

Figure 3F:
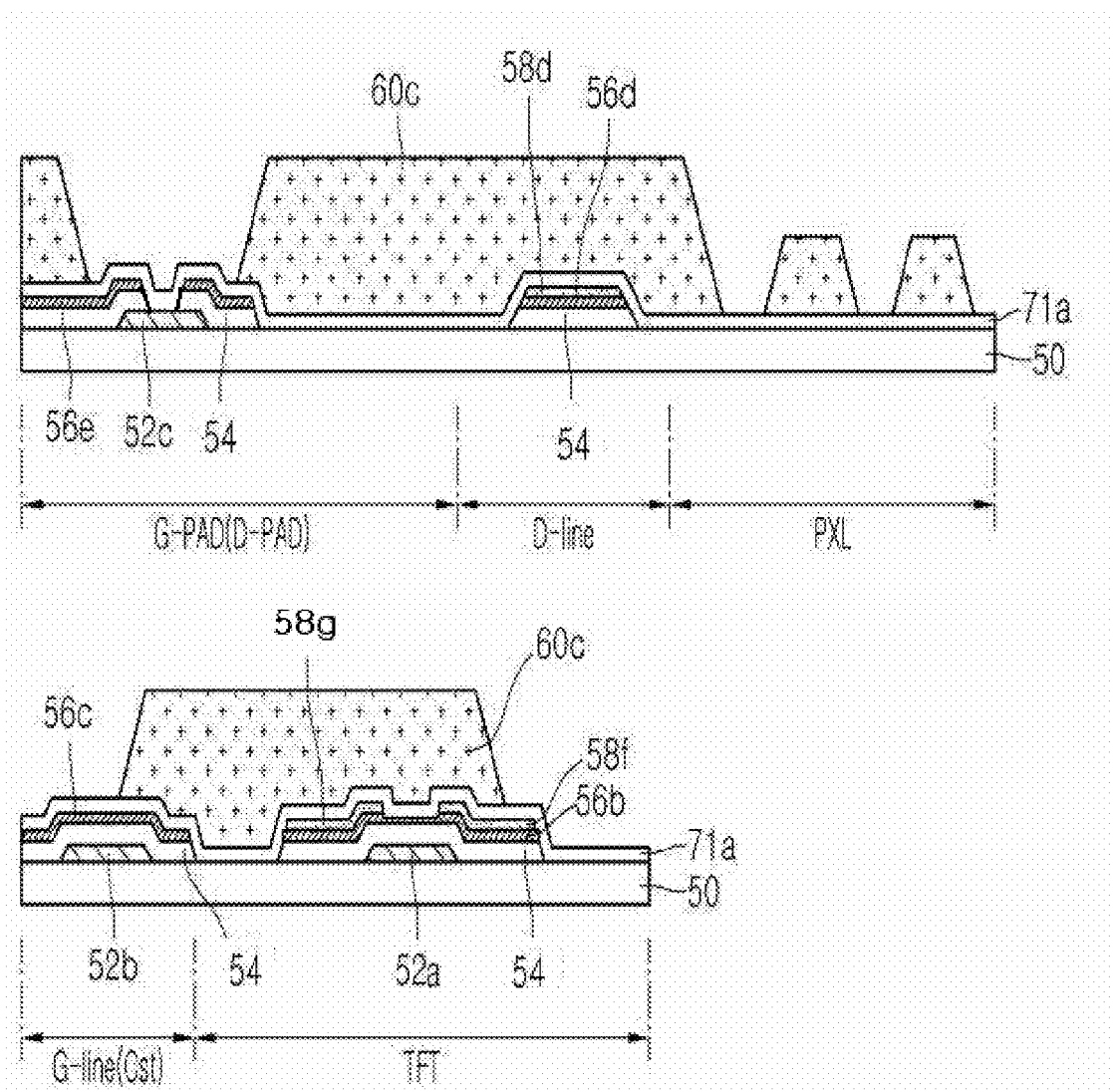

As shown in FIG. 3F, the third photoresist pattern 60b is removed from the substrate 50, where the second contact hole 70b for the gate pad are formed, before sequentially forming a protective film (or a passivation layer) 71a and a fourth photoresist pattern 60c on the substrate 50. The fourth photoresist pattern 60c is formed by forming a photoresist layer on the protective film 71a and photolithographing a third mask in the photoresist layer. For the third mask, a diffractive light exposure mask including a transmissive region transmitting the lights, a semi-transmissive region having a plurality of slits for partially transmitting and intercepting the lights, and an interceptive region intercepting the light may be used. The transmissive region is disposed in the gate pad formation region G-Pad(D-Pad), part of the gate line formation region G-Line(Cst), part of the pixel formation region PXL, and part of the thin film transistor formation region TFT where the drain electrode 58f is formed. The semi-transmissive region corresponds to the other part of the pixel formation region PXL. In other words, the transmissive and semi-transmissive regions included in the pixel formation region PXL are arranged alternately with each other.

Figure 3G:
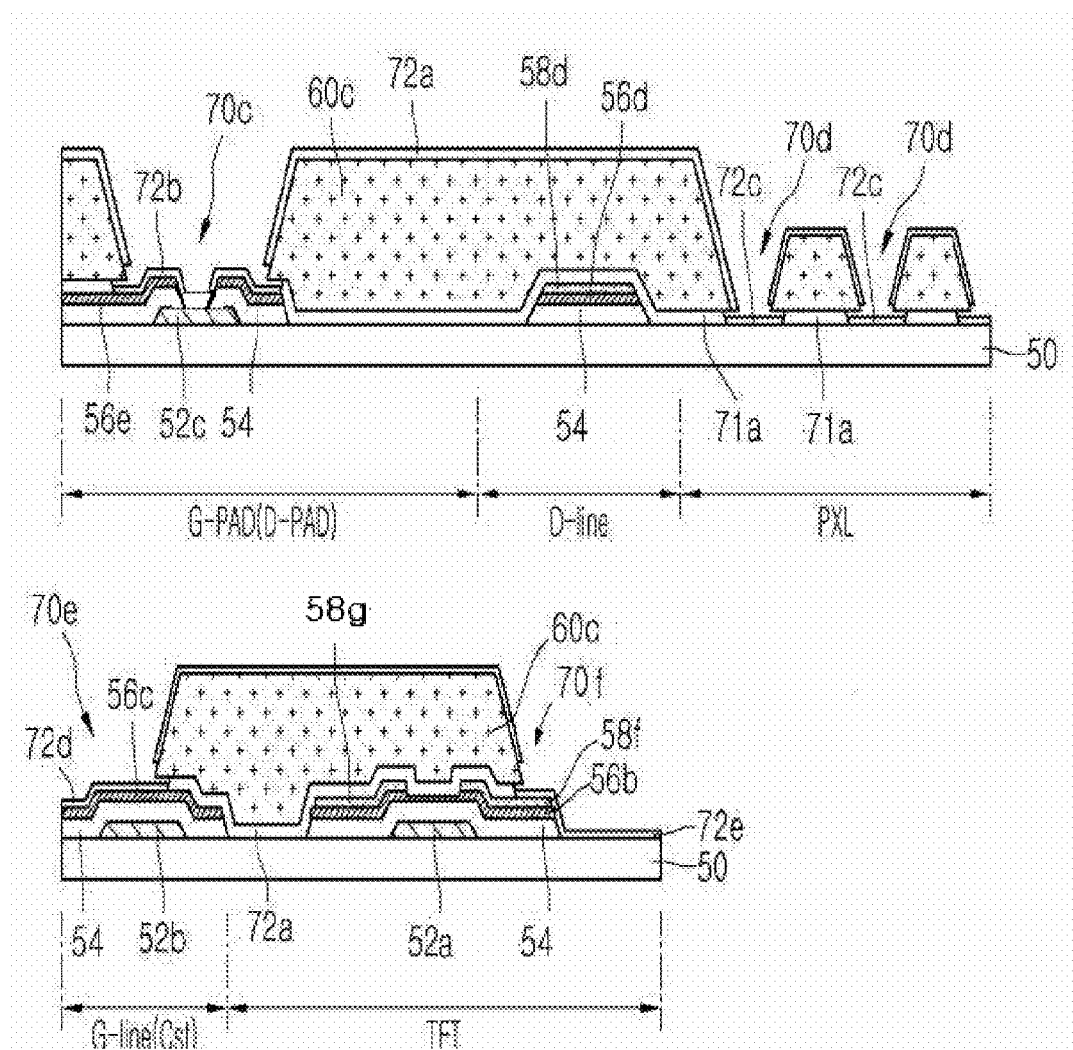

Referring to FIG. 3G, a third contact hole 70c for the gate pad, contact holes 70d for the pixel electrodes, a contact hole 70e for the gate line, and a contact hole 70f for the drain electrode are formed on the protective film 71a of the substrate 50 including the fourth photoresist pattern 60c, before providing a transparent conduction film 72a on the fourth photoresist pattern 60c.

The third contact hole 70c for the gate pad, the contact holes 70d for the pixel electrodes, the contact hole 70e for the gate line, and the contact hole 70f for the drain electrode are formed by etching the protective film 71a using the fourth photoresist pattern 60c as an etch mask. As such, the third contact hole 70c exposes the gate pad 52c in the gate pad formation region G-Pad, the contact hole 70d for the pixel electrode exposes the substrate 50 in the pixel formation region PXL, the contact hole 70e for the gate line exposes the semiconductor layer 56c in the gate line formation region G-line(Cst), and the contact hole 70f for the drain electrode exposes the drain electrode 58f in the thin film transistor formation region TFT.

In this way, the contact hole 70d for the pixel electrode is formed opposite the transmissive region of the third mask, and the semi-transmissive region is disposed on both sides of the transmissive region. In accordance therewith, the bottom surface of the contact hole 70d may be formed of a width of about 1.8~2.2 μm.

Also, the formation of the transparent conduction film 72a on the fourth photoresist pattern 60c provides a first transparent electrode 72b on the gate pad 52c exposed by the third contact hole 70c, a second transparent electrode 72c on the substrate 50 of the pixel formation region PXL which is exposed by the contact hole 70d for the pixel electrode, a third transparent electrode 72d on the semiconductor layer 56c of the gate line formation region G-line(Cst) which is exposed by the contact hole 70e, and a fourth transparent electrode 72e on the drain electrode 58f exposed by the contact hole 70f. In such a formation, the second transparent electrode 72c becomes a pixel electrode having a line width of about 1.8~2.2 μm because it is formed in the bottom surface of the contact hole 70d having a size of about 1.8~2.2 μm.

Figure 3H:
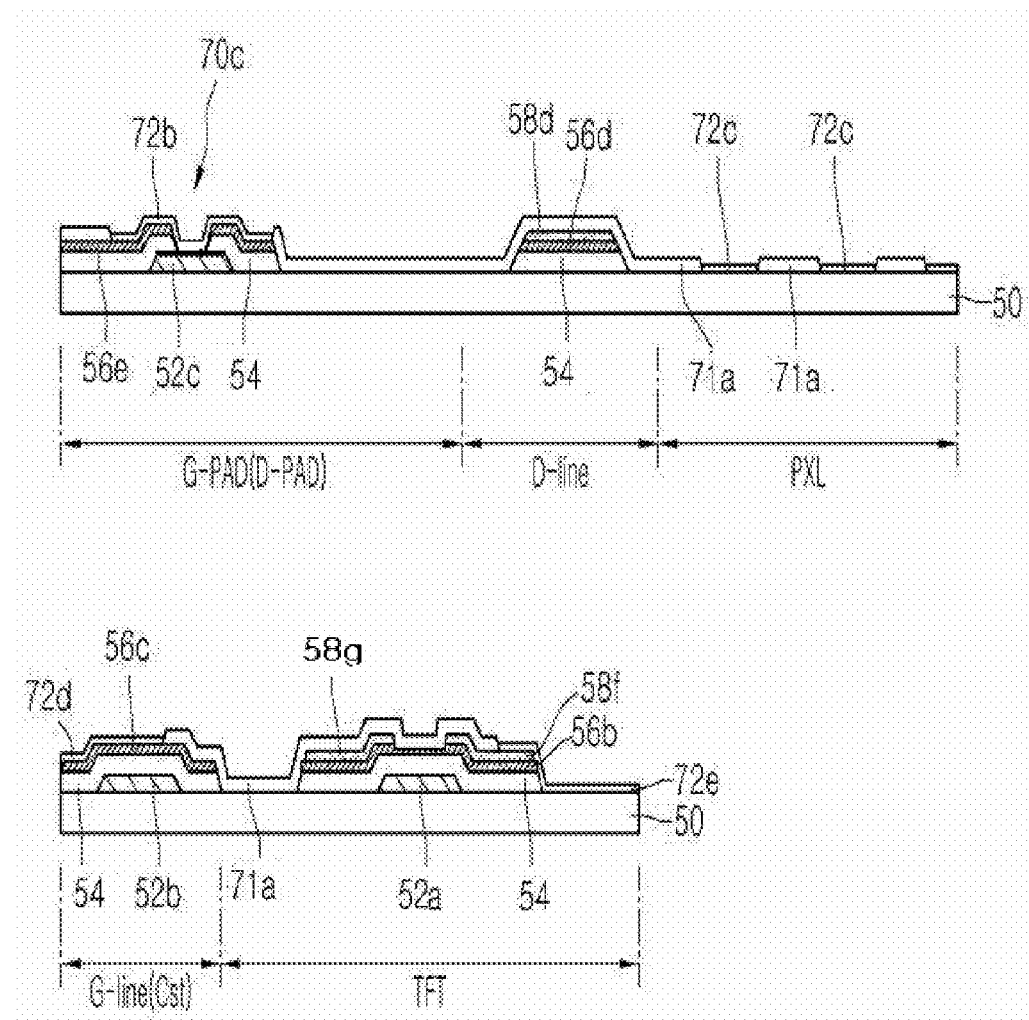

Next, the fourth photoresist pattern 60c is removed together with the transparent conduction film 72a thereon from the substrate 50 by performing a lift-off process, as shown in FIG. 3H, so that the manufacturing process of the thin film transistor array substrate is finished.

In this way, the steps of manufacturing the thin film transistor array substrate according to the second embodiment of the present disclosure are reduced below the 26 manufacturing steps of the method according to the related art which uses the four masks.

Actually, the method of the second embodiment using three masks includes the first step of washing the substrate, the second step of sputter-depositing the metal film for the gate electrode, the third step of secondly washing the substrate, the fourth step of performing photolithography with the use of the first mask, the fifth step of etching the metal film for the gate electrode, the sixth step of stripping, the seventh step of CVD-depositing the gate insulation film, the eighth step of CVD-depositing the semiconductor layer, the ninth step of sputter-depositing the metal film for the source/drain electrodes, the tenth step of thirdly washing the substrate, the eleventh step of performing photolithography with the use of the second mask, the twelfth step of firstly etching the metal film for the source/drain electrodes, the thirteenth step of etching the semiconductor layer and the gate insulation film to form the structure of FIG. 3C, the fourteenth step of secondly etching the metal film for the source/drain electrodes to form the structure of FIG. 3D, the fifteenth step of etching the etched semiconductor and gate insulation layers to form the structure of FIG. 3E, the sixteenth step of stripping, the seventeenth step of CVD-depositing the protective film, the eighteenth step of washing the substrate, the nineteenth step of performing photolithography with the use of the third mask, the twentieth step of etching the protective film, the twenty-first step of sputter-depositing the metal film for the pixel electrode, and the twenty-second step of stripping.

As thus described, the manufacturing method of the thin film transistor array substrate using three masks can reduce the process by four steps in comparison with the one using four masks, thereby providing the effect of manufacturing process simplification.

Also, the second transparent electrode 72c for the pixel electrode is formed in the line width of about 1.8~2.2 μm and increases the aperture ratio of pixel, with the effect of providing improved brightness.

Moreover, since only the second metal layer patterns 58c and 58e formed of molybdenum are removed with the exception of the semiconductor layer patterns 56c and 56e for the gate pad and gate line, the point defect in the related art caused by connecting the residents of the second metal pattern 58c with the first metal pattern 52b, which is used for the lower electrode of the storage capacitor, can be prevented.

Figure 4A:
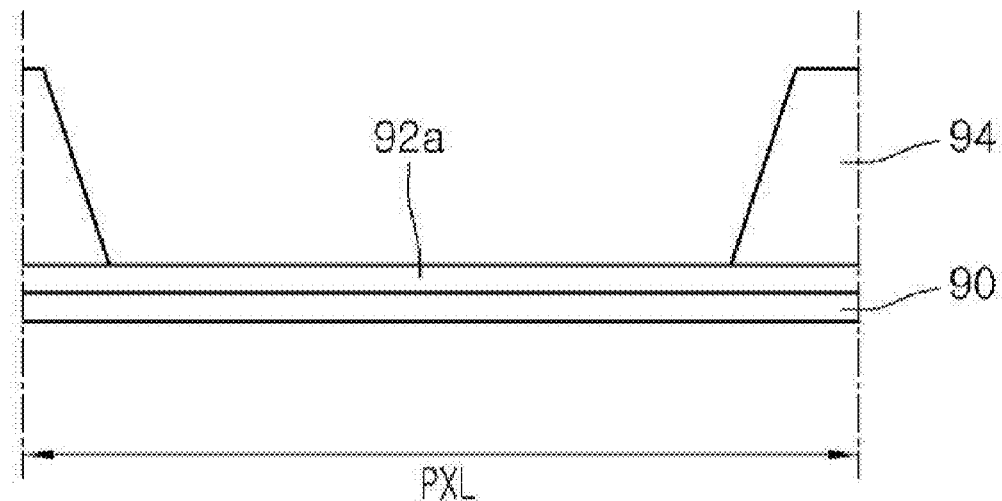
FIG. 4A to 4C are cross sectional views sequentially explaining the steps of a manufacturing method of TFT array substrate according to a third embodiment of the present disclosure.
Figure 4B:
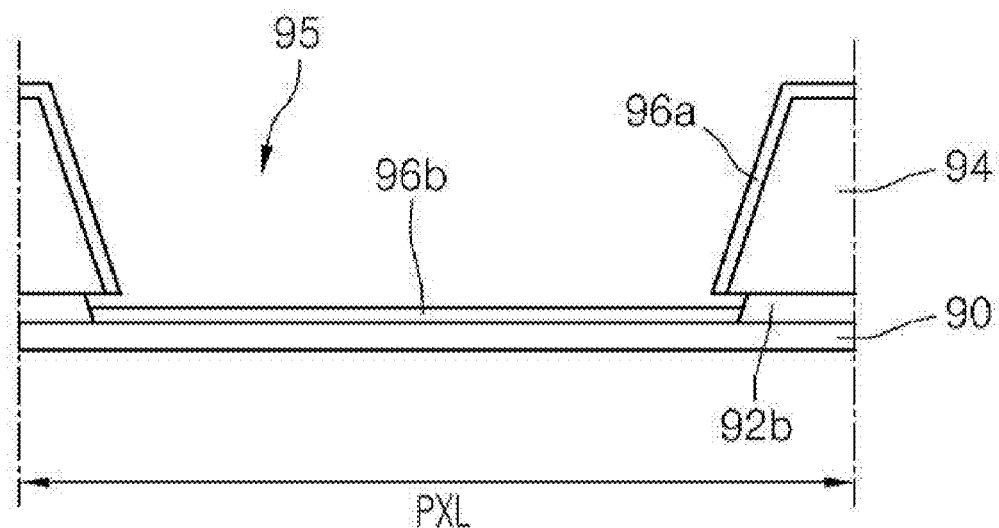
Figure 4C:
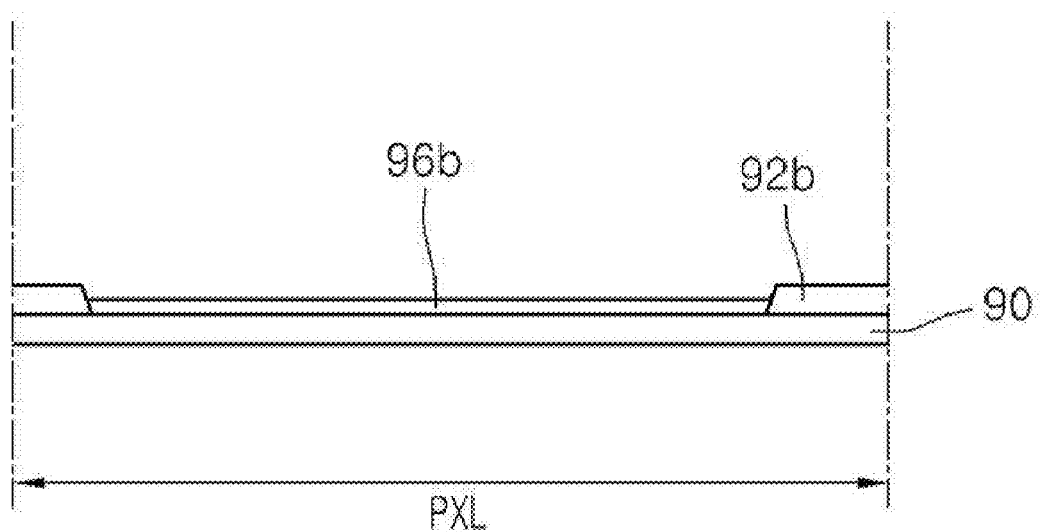

FIGS. 4A to 4C are cross sectional views explaining a manufacturing method of thin film transistor array substrate according to a third embodiment of the present disclosure. The method of the third embodiment also proceeds on triple mask process. The thin film transistor array substrate manufactured by the method of the third embodiment is also applied to the LCD device of vertical electric field system. As such, the method of the third embodiment follows the same process as the one of the second embodiment, with the exception of the pixel formation region PXL. Therefore, the manufacturing method of thin film transistor array substrate according to the third embodiment of the present disclosure will be described only regarding the pixel formation region PXL.

As shown in FIG. 4A, a protective film (or a passivation layer) 92a is firstly formed on the substrate 90, before forming a photoresist pattern 94, which defines the pixel region, on the protective film 92a.

Sequentially, a contact hole 95 for the pixel electrode is formed with the use of the photoresist pattern 94, before forming a transparent conduction film 96a on the photoresist pattern 94, as shown in FIG. 4B.

In order to form the contact hole 95 for the pixel electrode, the protective film 92a is partially etched by using the photoresist pattern 94 as an etch mask. Then, the transparent conduction film 96a is formed on the contact hole 95 and the photoresist pattern 94, thereby forming a transparent electrode 96b on the pixel formation region PXL of the substrate 90 which is exposed through the contact hole 95 for the pixel electrode. This transparent electrode 96b is used as the pixel electrode.

Finally, the photoresist pattern 94 is removed from substrate 90 through a lift-off process. As such, the manufacturing method of thin film transistor array substrate according to the third embodiment is finished.

In this way, the manufacturing method of thin film transistor array substrate according to the third embodiment can provide the same process simplification effect as the one according to the second embodiment.

Also, since only the pixel electrode 96b is formed in the pixel formation region PXL without the protective film 92a and the gate insulation film, the method of the second embodiment can reduce the using amount of liquid crystal used in comparison with the related art method forming the protective and gate insulation films on the pixel formation region.

As described above, the manufacturing method of thin film transistor array substrate according to the embodiments of the present disclosure use only three masks, thereby reducing the process steps as well as cutting down the manufacturing cost.

It will be apparent to those skilled in the art that various modifications and variations can be made in the present disclosure. Thus, it is intended that the present disclosure cover the modifications and variations of this embodiment provided they come within the scope of the appended claims and their equivalents.

What is claimed is:

1. A method of manufacturing a thin film transistor array substrate, comprising:
    forming a first photoresist pattern on a first metal layer with a use of a first mask;
    forming gate electrodes, gate lines and gate pads on a substrate with the use of a first photoresist pattern;
    forming a gate insulation film, a semiconductor layer, and a second metal layer on the substrate;
    forming a second photoresist pattern on the second metal layer with the use of a second mask;
    forming first contact holes for the gate pads with the use of the second photoresist pattern;
    ashing the second photoresist pattern to form a third photoresist pattern, and forming patterns for data pads, data lines, and thin film transistors with the use of the third photoresist pattern;
    ashing the third photoresist pattern to form a fourth photoresist pattern, and forming contact holes for source/drain electrodes and second contact holes for the gate pads with the use of the fourth photoresist pattern;
    forming a protective film on the substrate and providing a fifth photoresist pattern on the protective film with the use of a third mask;
    forming third contact holes for the gate pads, contact holes for the data pads, gate lines, and drain electrodes, and contact holes for pixel electrodes, with the use of the fifth photoresist pattern;
    forming a transparent conduction film on the fifth photoresist pattern having the contact holes, to provide first transparent electrodes for the gate pads into the third contact holes, second transparent electrodes into the contact holes for the data pads, third transparent electrodes into the contact holes for the pixel electrodes, fourth transparent electrodes into the contact holes for the gate lines, and fifth transparent electrodes into the contact holes for the drain electrodes; and
    removing the fifth photoresist pattern,
        wherein the third mask includes transmissive regions transmitting lights, semi-transmissive transmissive regions partially transmitting and intercepting the lights, and interceptive regions intercepting the lights, and the three regions have different transmittances.

2. The method claimed as claim 1, wherein the second mask includes a transmissive region transmitting the lights, first and second semi-transmissive regions partially transmitting and intercepting the lights, and an interceptive region intercepting the lights, and the four regions have different transmittances.

3. The method claimed as claim 1, wherein parts of the fifth photoresist pattern forming the contact holes for the pixel electrodes are opposed to the semi-transmissive regions and transmissive regions of the third mask which is alternately arranged.

4. The method claimed as claim 1, wherein the third transparent electrode is about 1.8 to about 2.2 μm in width.

5. The method claimed as claim 1, wherein the metal layer includes copper Cu.

6. A method of manufacturing a thin film transistor array substrate, comprising:
    forming a first photoresist pattern on a first metal layer with a use of a first mask;
    forming gate electrodes, gate lines and gate pads on a substrate with the use of a first photoresist pattern;
    forming a gate insulation film, a semiconductor layer, and a second metal layer on the substrate;
    forming a second photoresist pattern on the second metal layer with the use of a second mask;
    forming first contact holes for the gate pads, patterns for the gate pads and gate lines, and patterns for data lines and thin film transistors, with the use of the second photoresist pattern;
    ashing the second photoresist pattern to form a third photoresist pattern, and forming source/drain electrodes and second contact holes for the gate pads and removing the metal layer of the patterns for the gate pads and lines, with the use of the third photoresist pattern;
    forming a protective film on the substrate and providing a fourth photoresist pattern on the protective film with the use of a third mask;
    forming third contact holes for the gate pads, contact holes for pixel electrodes, and contact holes for the gate lines and drain electrodes, with the use of the fourth photoresist pattern;

forming a transparent conduction film on the fourth photoresist pattern having the contact holes, to provide first transparent electrodes into the third contact holes for the gate pads, second transparent electrodes into the contact holes for the pixel electrodes, third transparent electrodes into the contact holes for the gate lines, and fourth transparent electrodes into the contact holes for the drain electrodes; and removing the fourth photoresist pattern, wherein the third mask includes transmissive regions transmitting lights, semi-transmissive regions partially transmitting and intercepting the lights, and interceptive regions intercepting the lights, and the three regions have different transmittances.

7. The method claimed as claim 6, wherein parts of the fourth photoresist pattern forming the contact holes for the pixel electrodes are opposed to the semi-transmissive regions and transmissive regions of the third mask which is alternately arranged.

8. The method claimed as claim 6, wherein parts of the fourth photoresist pattern forming the contact holes for the pixel electrodes are opposed only to the transmissive regions of the third mask.

9. The method claimed as claim 6, wherein the second transparent electrode is about 1.8 to about 2.2 μm in width.

10. The method claimed as claim 6, wherein the metal layer includes molybdenum Mo.

* * * * *